(12) United States Patent
Shirota et al.

(10) Patent No.: US 11,049,942 B2
(45) Date of Patent: Jun. 29, 2021

(54) POWER SEMICONDUCTOR DEVICE

(71) Applicants: Te-Chang Tseng, Hsinchu County (TW); Riichiro Shirota, Fujisawa (JP)

(72) Inventors: Riichiro Shirota, Fujisawa (JP); Yung-Yueh Chiu, New Taipei (TW); Te-Chang Tseng, Hsinchu County (TW); Hiroshi Watanabe, Yokohama (JP)

(73) Assignees: Te-Chang Tseng, Hsinchu County (TW); Riichiro Shirota, Fujisawa (JP)

( * ) Notice: Subject to any disclaimer, the term of this patent is extended or adjusted under 35 U.S.C. 154(b) by 0 days.

(21) Appl. No.: 16/680,792

(22) Filed: Nov. 12, 2019

(65) Prior Publication Data
US 2020/0168707 A1    May 28, 2020

(30) Foreign Application Priority Data

Nov. 22, 2018  (JP) .............................. JP2018-219784

(51) Int. Cl.
| | |
|---|---|
| H01L 29/16 | (2006.01) |
| H01L 29/36 | (2006.01) |
| H01L 29/165 | (2006.01) |
| H01L 29/78 | (2006.01) |
| H01L 29/10 | (2006.01) |

(52) U.S. Cl.
CPC ...... *H01L 29/1608* (2013.01); *H01L 29/1095* (2013.01); *H01L 29/1602* (2013.01); *H01L 29/36* (2013.01)

(58) Field of Classification Search
CPC ......... H01L 29/16; H01L 29/36; H01L 29/78; H01L 29/165; H01L 29/1602; H01L 29/1608; H01L 29/7813

USPC .......................................................... 257/77
See application file for complete search history.

(56) References Cited

U.S. PATENT DOCUMENTS

2018/0366569 A1* 12/2018 Zeng ................... H01L 29/1095

FOREIGN PATENT DOCUMENTS

WO    WO-2019239632 A1 * 12/2019 ............. H01L 29/78

OTHER PUBLICATIONS

Nakagawa et al. "1800V Bipolar-Mode MOSFETs: a first application of Silicon Wafer Direct Bonding (SDB) technique to a power device", Toshiba Research and Development center, 1986 IEEE.
Noguchi et al. "Determination of intrinsic phonon-limited mobility and carrier transport property extraction of 4H—SiC MOSFETs", Advanced Technology R & D Center, Mitsubishi Electric Corporation and Department of Materials Engineering, The University of Tokyo, 2017 IEEE.
Maes et al. "Impact Ionization in Silicon: A review and update", Solid-State Electronics vol. 33, No. 6, pp. 705-718, 1990.

(Continued)

*Primary Examiner* — Fazli Erdem
(74) *Attorney, Agent, or Firm* — WPAT, PC

(57) ABSTRACT

A semiconductor device based on SiC-MOSFET realizes high voltage endurance, high current, low breakover voltage, low switching loss and low noise. The SiC-MOSFET is a combination of a Si-MOSFET with high channel mobility and a drift layer formed by SiC with high bulk mobility, so that the first conductive SiC wafer forming the drift layer joins the second conductive Si wafer, excavates out a trench gate in part of the SiC to make the MOSFET, and a second conductive barrier layer is arranged in the Si region adjacent to the SiC.

18 Claims, 13 Drawing Sheets

(56) References Cited

OTHER PUBLICATIONS

Sridevan et al. "Lateral N-Channel Inversion Mode 4H—SiC MOSFET's" IEEE Electron Device Letters, vol. 19, No. 7, Jul. 1998.
Shigekawa, "Bonding of Dissimilar Semiconductor Materials for Energy-Harvesting and Energy-Saving Devices", Department of Applied Physics and Electronics, Graduate School of Engineering, Osaka City University, pp. 421-427, vol. 60, No. 11, 2017.

* cited by examiner

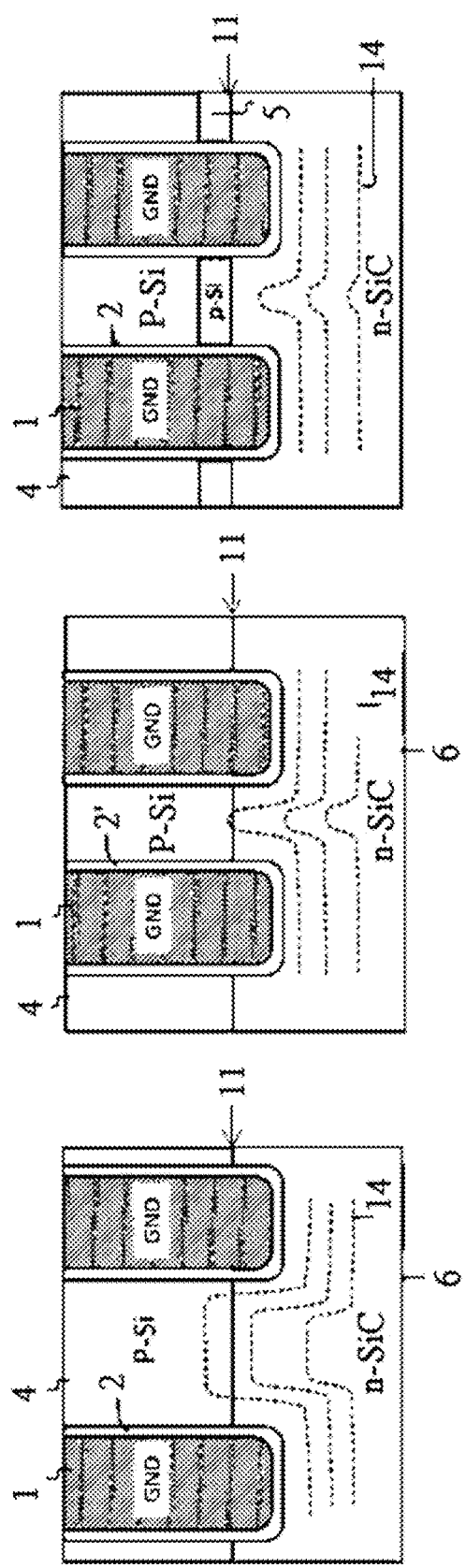

POWER SEMICONDUCTOR DEVICE

CROSS REFERENCE TO RELATED APPLICATION

The application claims the benefit of Japanese Patent Application Serial No. 2018-219784, filed on Nov. 22, 2018, and the entire contents of which are incorporated herein by reference.

BACKGROUND OF THE INVENTION

1. Field of the Invention

The invention relates to a MOS type transistor device suitable for use as a switching element in electric power and its manufacturing method.

2. Description of the Related Art

In the field of power semiconductor devices, power switches such as insulated gate bipolar transistors (IGBTs) or metal-oxide-semiconductor field effect transistors (MOS-FETs) made of silicon are commonly used in the past. However, for the purpose of energy efficiency in low carbon society, the above performance is considered to nearly reach the limit. On the other hand, in recent years, the development of alternative technology using new crystallization materials called wide band gap has been expected, but there are many technical problems in performance, cost and reliability. As a result, the mass production is difficult, making it necessary to improve the conventional power switches.

The conventional technologies can be referred to, such as U.S. Pat. No. 5,506,421 (Patent Literature 1), U.S. Pat. No. 5,396,085 (Patent Literature 2), U.S. Pat. No. 5,323,040 (Patent Literature 3), U.S. Pat. No. 5,614,749 (Patent Literature 4), Japan Patent No. 5,610,492 (Patent Literature 5), Japan Publication No. 2013-243333 (Patent Literature 6) etc.

Reference can also be made to "Lateral n-channel inversion mode 4H-SiC MOSFETs", S. Sridenvan et. al. IEEE Electron Device Letters, Vol. 19, Issue: 7, July 1998 (Non-patent Literature 1), "Determination of intrinsic phonon-limited mobility and carrier property extraction of 4H-SiC MOSFET", Noguchi, et al. 9.3.1 IEDM17, pp 219-222. (2017) (Non-patent Literature 2), "1800V Bipolar mode MOSFETs: a first application of Silicon wafer Direct Bonding (SDB) technology to a power device", A. Nakagawa, IEDM86, 5.6, pp 122-125 (Non-patent Literature 3), "Matching of heterogeneous semiconductor materials for energy creation and energy saving devices", Chongchuan Zhihui, J. Vac. Soc. Jpn. Vol. 60, No. 11, (2017) 421-427 (Non-patent Literature 4), "Impact Ionization in Silicon: A REVIEW and UPDATE", W. MAES, et al. Solid State Electronics Vol. 33, No. 6 pp 705-718, 1990 (Non-patent Literature 5).

The mainstream of power transistors is IGBT and MOSFET made of silicon material (hereinafter referred to as Si), where the IGBT is a bipolar device. Therefore, by means of the carrier conduction modulation effect, the low-concentration N-type drift layer on the P-type collector can be made low resistivity, thus achieving high voltage endurance and high current. However, in a switching off operation, the higher-order injected electrons recombine with the holes to eliminate the carrier requires a descent time, which results in a slower switching action and thus increases the switching loss. In contrast, the MOSFET made of Si (hereinafter referred to as Si-MOSFET) is a unipolar device, so the recombination speed of the low-concentration drain diffusion layer (hereinafter referred to as a drift layer) on the high-concentration drain diffusion layer does not constitute a problem. Therefore, it has the advantage of less switching loss. However, increasing the thickness of the drift layer in order to improve the voltage endurance under a high voltage will increase the resistance and breakover voltage under on-state, which will lead to the shortcomings of increasing energy loss and not suitable for high voltage applications. FIG. 1a shows a cross sectional view of the known Si-MOSFET.

In view of the technical limitations of the above-mentioned Si devices, wide band gap semiconductors are expected to be used as alternative next-generation power semiconductor materials in recent years. Among them, the band gaps of silicon carbide (hereinafter referred to as SiC) and gallium nitride (hereinafter referred to as GaN) are three times as high as that of Si, and the voltage endurance is about 10 times higher. On the other hand, they have the same mobility as that of Si. Because of this advantage, wafer thinning can also be used in high voltage applications, so the on-resistance can be reduced to achieve a high voltage and speed operation. In addition, because of its high thermal conductivity and excellent heat dissipation, it is easy to cool and can be used for high temperature operations. Therefore, it will be greatly anticipated for use as a power semiconductor for high-speed and high-power applications.

However, the high cost of SiC wafers and the need for high temperature heat treatment steps in wafer fabrication compared with Si are considered as manufacturing problems.

It has been a long time since the beginning of research (Non-patent Literature 1) of using SiC crystallization to fabricate MOSFETs (hereinafter referred to as known SiC-MOSFETs). However, the problem of low channel mobility (about $10^2$ less than Si in magnitude) of the conduction electrons due to the quality of gate thermal oxide film interface has not been fully solved. It is speculated that there are many defects in the interface (energy state density of the interface) between gate insulating film and SiC, so the channel mobility becomes lower (Non-patent Literature 2). In other words, although the mobility of the electrons in bulk crystallization of SiC is known to be 800-1000 cm/v·sec, the surface channel mobility of the MOSFET is very low, which is 10 cm/v·sec (Si plane).

Therefore, the actuation of the device restricted by a serious problem is that although the resistance of the SiC drift layer formed on the substrate drain diffusion layer is low enough, the channel resistance of the MOSFET is too high. As a result, the breakover voltage rises and the energy loss increases, so that the advantages of SiC cannot be fully utilized. FIG. 1b is a cross sectional view of the known SiC-MOSFET. The surface state of interface 71 under the gate oxide film hinders the conduction of channel electrons, so the current gain decreases. Moreover, in the trenched longitudinal SiC-MOSFET structure (Patent Literature 1), even if the gate oxide film is thinned to enhance the driving capability, the insulation failure defects often occur at the trench corner gate oxide film 73 due to the deterioration of the quality of the SiC thermal oxide film and the low voltage endurance. Although many annealing methods have been tried to overcome various defects of the SiC interface state or to improve the quality of the SiC thermal oxide film, the root cause of the deterioration has not been fully solved. Therefore, it is necessary to re-examine the fundamentals of understanding the interface state from the basic principles (Non-patent Literature 2). In such a situation, the problem to be solved by the present invention is to realize a MOSFET using SiC crystallization, which has less loss of conduction action and high voltage endurance.

In order to solve the previous problems, the structure of Si-MOSFET laminated on SiC is proposed in Patent Literature 2. FIG. 2 shows a cross sectional view of a known example. In its structure, a convex Si-MOSFET uses a sidewall gate 50, and a MESFET with a SiC Schottky junction electrode 62 is arranged on the bottom of the trench as an active load. It is assumed that the channel resistance can be reduced by the Si-MOSFET and the on-resistance of the whole device can be reduced by using a low resistance SiC substrate 48 in the drift layer. The breakdown electric field strength (0.33 MV/cm) in Si is only 1/10 of that of SiC. Thus, in order to avoid an avalanche breakdown in Si, the magnitude of electric field in Si must be reduced less than 1/10 of that in SiC (>1 MV/cm). However, there is a diffusion layer 57 formed at the bottom of the convex Si, so the strong electric field of the SiC drift layer will cause the Si potential to rise in the off-state. It is described in the patent that the electric field in Si can be reduced by narrowing the channel width as much as possible. However, the high density space charge under the N-type diffusion layer 57 rises the Si potential sharply, and the result is just the opposite and the expected effect cannot be achieved.

On the other hand, in the patent, the lower end of the sidewall trench gate 50 in FIG. 1 is higher than the Si and SiC heterojunction position 56. Therefore, the surface potential of the SiC region is not lowered by the electric field effect from the trench gate, and the electrons cannot cross the gap between the conduction bands and adversely hinder the channel conduction. However, in order to form a MESFET on the bottom and the side of the trench, the Schottky electrode 52 must be formed, and it is necessary to make the upper end of the electrode as close as possible to the SiC/Si interface. Therefore, it is physically impossible to make the bottom of the sidewall gate lower than that of the heterojunction position.

SUMMARY OF THE INVENTION

The invention proposes a Si-MOSFET stacked on a drift layer made by a SiC which has high mobility, and thereby provides a new device with high performance and a manufacturing method to solve the problem of the existing device mentioned above. Specific solutions are listed below.

The power semiconductor device of the invention is to directly join the second conductive Si substrate on the first conductive SiC substrate which start from the bottom electrode, and sequentially include drain diffusion layer of a first conductive type and a drift layer of first conductive type. A trench gate is formed by excavating a recess on the surface of Si to the SiC substrate through the bottom of Si substrate, and depositing the gate oxide film on the recess and subsequently filling polycrystalline silicon or metal on the gate oxide film. Here, the bottom position of the gate is lower than the joint position of SiC and Si. On the other hand, a second conductive impurity region (hereinafter referred to as a barrier layer) is formed near the bottom edge between the horizontal trench gates of the second conductive Si substrate and has a higher concentration than that of the Si substrate to fabricate a MOSFET with a gate and source conductive electrodes on the upper surface of the second conductive Si substrate.

The better condition is that the position of the bottom of the trench gate is more than 0.5 micron deeper than that of the drift layer of the first conductive SiC and the position of the heterojunction of the second conductive Si substrate. Thus, in the on-state, the conduction electrons at the MOS interface of the SiC drift layer can easily cross the energy barrier of the heterojunction of the Si/SiC conduction band, and the drain current can flow smoothly. On the other hand, the off-state is in a reverse bias state, so the high electric field from the first conductive SiC drift layer must be attenuated on the second conductive Si substrate. By configuring the interface of the SiC drift layer and the Si substrate in the inward direction between the trench gates, a barrier of the electric field is formed to moderate the electric field entering into Si. Moreover, if the angle portion at the bottom of the trench gate is sharp, the breakdown of the gate oxide may occur due to the concentration of the electric field. Therefore, it is necessary to make the angle portion rounded. A better radius of curvature is, for example, more than 0.05 microns. This is because the electric field strength is inversely proportional to the radius of the curvature of the gate, and the radius of the curvature is preferably a half of the gate width.

In the power semiconductor of the invention, the electric field of the second conductive Si substrate must be more intensively moderated in the off-state. It is preferred to arrange a source diffusion layer sandwiched by the two parallel gates whose space is narrow enough to reduce the electric field strength by the narrow channel effect below source diffusion area produced between the two trench gates. As a result, the potential distribution in Si decreases due to spatial modulation. In addition, a second conductive block barrier layer is arranged at the bottom of the second conductive Si substrate to provide an approach that further prevents the electric field from entering Si. The impurity concentration in the barrier layer to form the second conductive Si is higher than that in the Si substrate. By arranging the barrier layer, the width of the depletion layer can be limited in the off-state, making it unnecessary to excessively rely on the narrowing of the source diffusion area between the two trench gates. In the on-state, the barrier layer determines the channel surface potential and the channel length in essence, so it can supply current stably without being affected by the thickness of the Si substrate. In the invention, a stable and high performance can be achieved in the on-state and off-state by the SiC recess of the trench, the narrow channel effect between gates and the formation of the barrier layer.

In the power semiconductor device according to the invention, to reduce the resistance under the on-state by increasing the drain to source current, the channel width of the power transistor needs to be increased. Thus, in order to form longer channel width, a plurality of bar-shaped transistors with the trench gate are arranged in an array. At the edge of the array, a source diffusion layer made by the first conductive Si layer is only formed at a part sandwiched by the two gates to thereby reduce the source diffusion width. In the off-state, the gap is reduced to lower the distributed voltage in Si by the space modulation, thus weakening the electric field.

The manufacturing method of the power semiconductor device of the invention is to combine the SiC wafer forming the first conductive drift layer with the second conductive Si wafer by surface activated bonding technology (Non-patent Literatures 3 and 4). After grinding and film forming, a trench is excavated from the Si side to make a part of the Si substrate and the SiC substrate into a recess. After the gate oxide film is formed, the embedded gate is formed in the trench with polycrystalline silicon. A MOSFET has a second conductive barrier layer formed at the bottom of the second conductive Si substrate between the trench gates. The first and second conductive diffusion layers and the electrodes connecting the diffusion layers are formed to electrically connect the source region to the substrate.

By means of the device configuration and its suitable manufacturing method of the invention, a MOSFET with low loss and high voltage endurance is designed. In a conducting operation, the problem that the interface defect of the SiC oxide film leads to the deterioration of the channel mobility can be avoided by converting to the MOS channel using Si crystallization. Especially for the SiC/Si heterojunction, the trench gates overlap the SiC (recess) side sufficiently. By this way, the gap between the conduction bands can be easily crossed by the electrons in the on-state, and a large drain current can be obtained. Moreover, by disposing the second conductive barrier layer at the bottom of the same type Si substrate, the channel length can be determined in essence. Therefore, even if the thickness of the substrate is slightly uneven, a stable current flow can be maintained. With this structure, the Si and SiC fully conductive regions extending from the source to the drain can maintain high conductivity stably and achieve a low breakover voltage. Because the input is constructed by Si-MOSFET, the gate input pulse amplitude can be lower than that of the previous SiC-MOSFET, so it can also reduce the oscillating noise or radiation.

On the other hand, in the off-state of the conventional Si-MOSFET, there is no alternative approach for high voltage endurance except for thickening the drift layer. However, in the present invention, because the drift layer uses SiC, the performance can be greatly improved. The approaches to prevent the strong electric field from entering the Si region from the SiC drift layer are to narrow the Si channel region between the trench gates to produce a narrow channel effect as well as to enhance the narrow channel effect by forming the second conductive barrier layer in the Si region, thereby effectively preventing the high electric field from entering the Si region. In addition, the formation of the trench gate into the SiC region (recess) can also effectively inhibit the electric field entering the second conductive Si substrate. By properly combining the above approaches, a low on-resistance can be achieved and the avalanche breakdown in Si substrate under a high voltage off-state can be inhibited, thus achieving high performance devices that previously could not be attained by the Si-MOSFET, Si-IGBT and SiC-MOSFET.

To reduce the resistance under the on-state, the channel width of the power transistor needs to be increased so as to flow large drain to source current. Thus, a plurality of bar-shaped transistors with the gate lengths is arranged in an array. At the edge of the array, a source diffusion layer made by the first conductive Si layer is only formed at a part sandwiched by the two gates to thereby reduce the source diffusion width. Thus, in the arrayed power transistors, the channel area below the source diffusion layer can also be narrowed, realizing a component with a high voltage resistance in an off-state.

BRIEF DESCRIPTION OF THE DRAWINGS

FIG. 5b-1 shows a potential distribution of the device of FIG. 5a under a relatively wide channel width.
FIG. 5b-2 shows a potential distribution of the device of FIG. 5a under a relatively narrow channel width.
FIG. 5b-3 shows a potential distribution of the device of FIG. 5a under a relatively narrow channel width and a presence of a P-type barrier layer.

DETAILED DESCRIPTION OF THE INVENTION

Figure 1B:
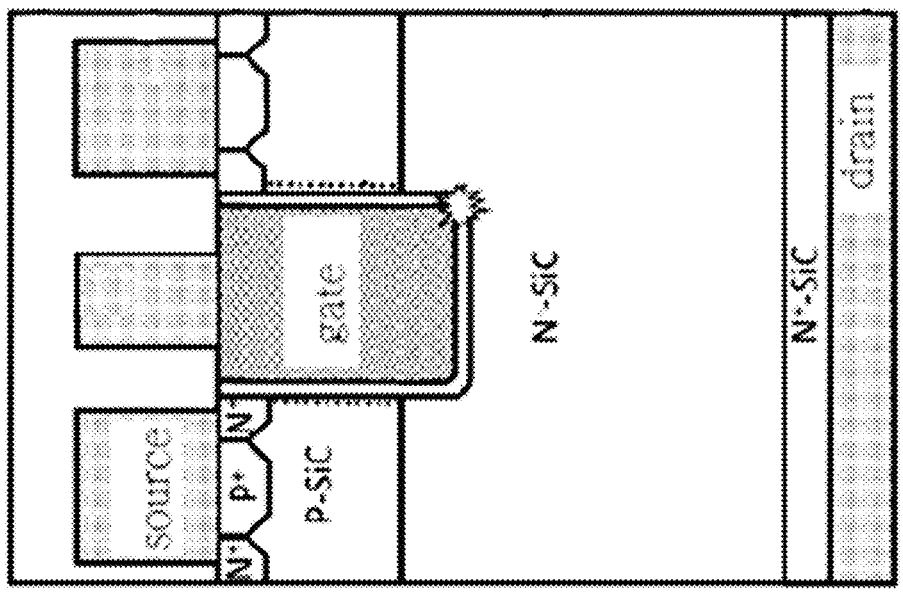
FIG. 1b is a cross sectional view of a known SiC-MOSFET.

The invention provides a novel power MOSFET structure with Si as the MOSFET part and SiC as the drift layer part, and a process of integrating Si wafer and SiC wafer into together by a direct joining method can be used as the manufacturing method of the power MOSFET.

A first embodiment is described in detail below with FIGS. 3 and 4. FIG. 3a is a cross sectional view of another MOSFET of the present invention. Reference number 10 in the figures refers to an element with the second conductive type, such as a P-type diffusion layer. Reference number 3 refers to an element with the first conductive type, such as an N-type source diffusion layer. Hereinafter, the first conductive type is regarded as N-type, the second conductive type as P-type, and vice versa. Reference number 1 is a gate, 3 is an N-type source diffusion layer, 4 is a P-type Si bulk layer, and 5 is a P-type substrate with a higher concentration than the P-type substrate, which is specified as a P-type barrier layer. Reference number 8 is a common metal electrode connecting to the N-type source diffusion layer 3 and a P-type Si. The metal electrode 8 remains grounded. Reference number 9 is the gate trace. Reference number 6 is an N-type drift layer formed by N-type SiC, 7 is a drain diffusion layer of the N-type SiC, 13 is a drain electrode, and 12 is an inter-layered insulating film. Different from the conventional SiC-MOSFET is that the P-type barrier layer 5, the N-type source diffusion layer 3, the P-type diffusion layer 10 and the P-type Si bulk layer 4 in the MOSFET region are formed in the Si substrate, and that the N-type drain diffusion layer 7 and the N-type drift layer 6 are formed in the MOSFET region are formed in the SiC substrate. As shown in the figures, the depth of the gate is larger than that of the Si/SiC interface 11 and reaches the inner region of the SiC. In addition, the gate is formed from polycrystalline silicon or metal. The position of the P-type barrier layer 5 of the P-type Si substrate is formed near the Si/SiC interface 11 between the SiC drift layer and the Si substrate. Here, the bottom of the gate is overlapped with the heterojunction such that the gate electric field and the channel current are not blocked by the drift region.

Figure 3A:
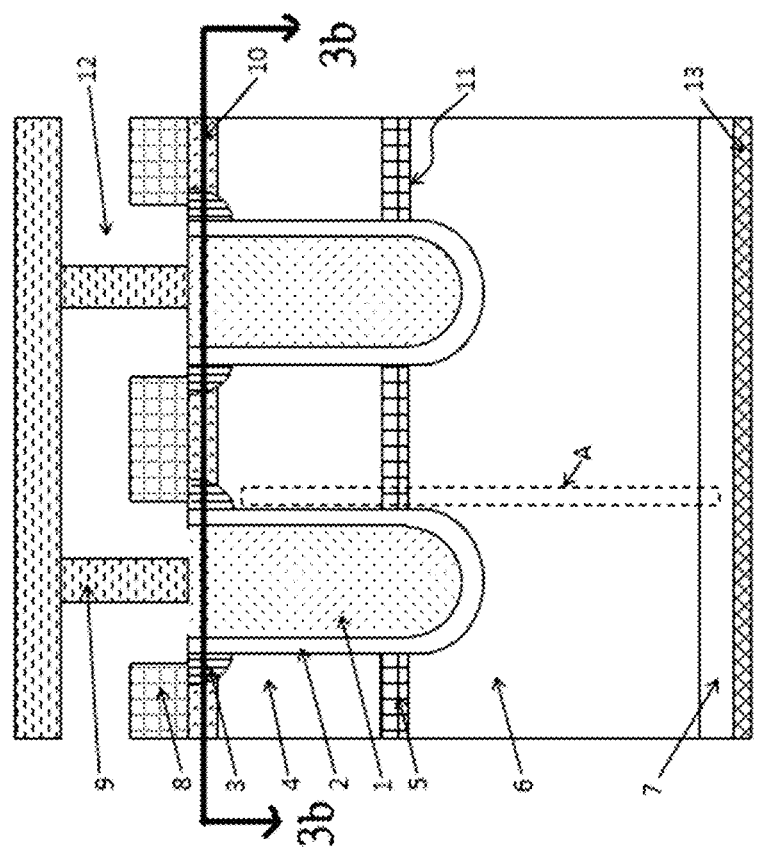
FIG. 3a is a cross sectional view of the device of the present invention
Figure 4A:
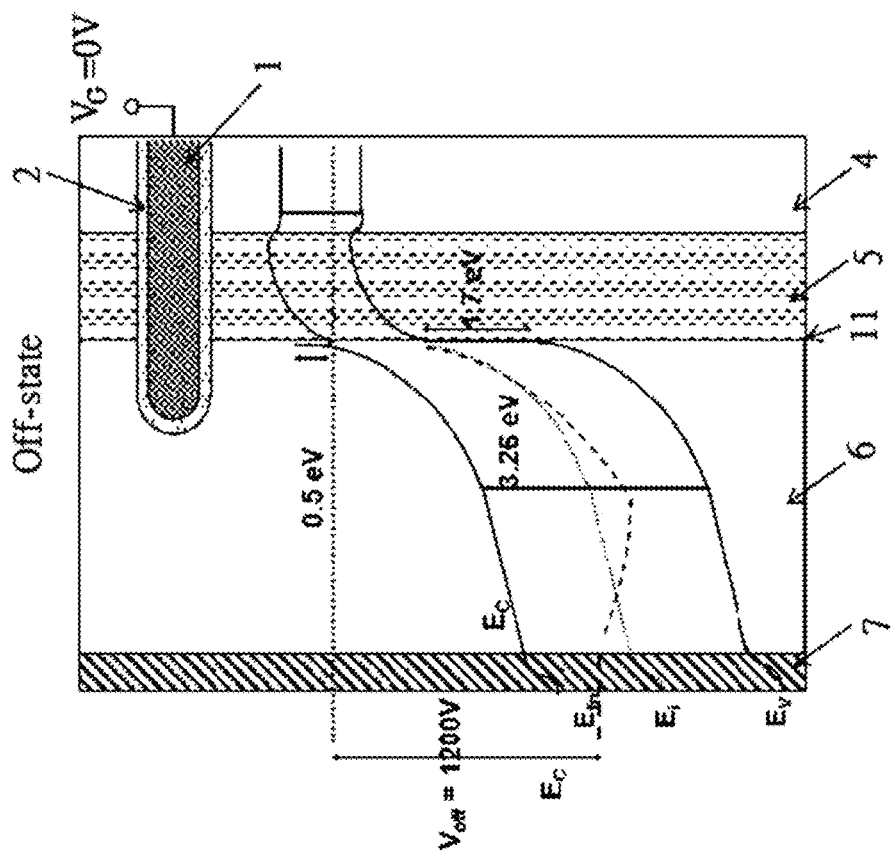
FIG. 4a is an on-state band diagram of the device of FIG. 3a taken along area A.

Regarding the power device as fabricated by the above method, the operation of the MOSFET can be illustrated from the viewpoint of energy band. FIG. 4a is an energy band diagram showing the on-state of the dashed area A in FIG. 3a, which illustrates the injection mechanism of the electrons into the drift layer of the Si/SiC interface 11 in the on-state. As shown in the figure, the energy state of SiC at the conduction band end is 0.5 eV higher than that of Si, thus forming a barrier for the conducting electrons. In the MOS structure, the free electrons in the Si substrate are filled to the energy conduction band end of SiC by the gate electric field. In order for the conducting electrons to cross the energy barrier, the surface potential of the SiC is increased by expanding the electric field from the trench gate in the MOS structure of the SiC recess. Then, the electrons can easily cross the energy barrier of the SiC, and the electrons can be injected into the N-type drift layer 6. On the other hand, the channel potential decreases in the P-type barrier layer 5, such that the current in this region is controlled by the electric field effect. This can be considered as the channel length in essence. As a result, the drain current remains constant and is independent of the thickness of the substrate.

Figure 1A:
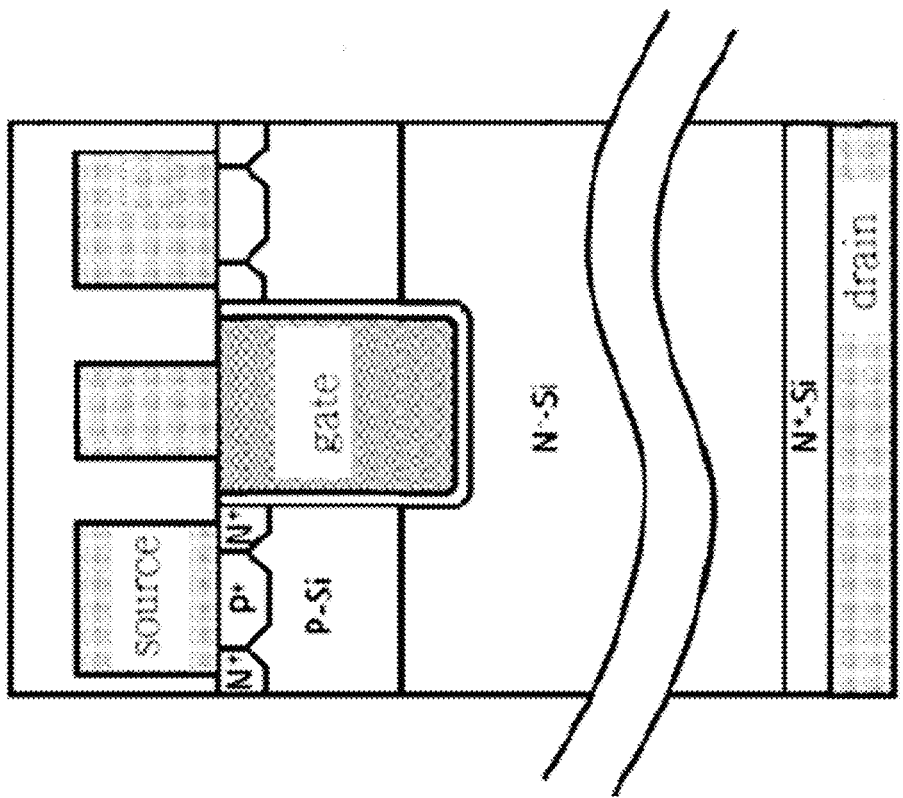
FIG. 1a is a cross sectional view of a known Si-MOSFET.
Figure 2:
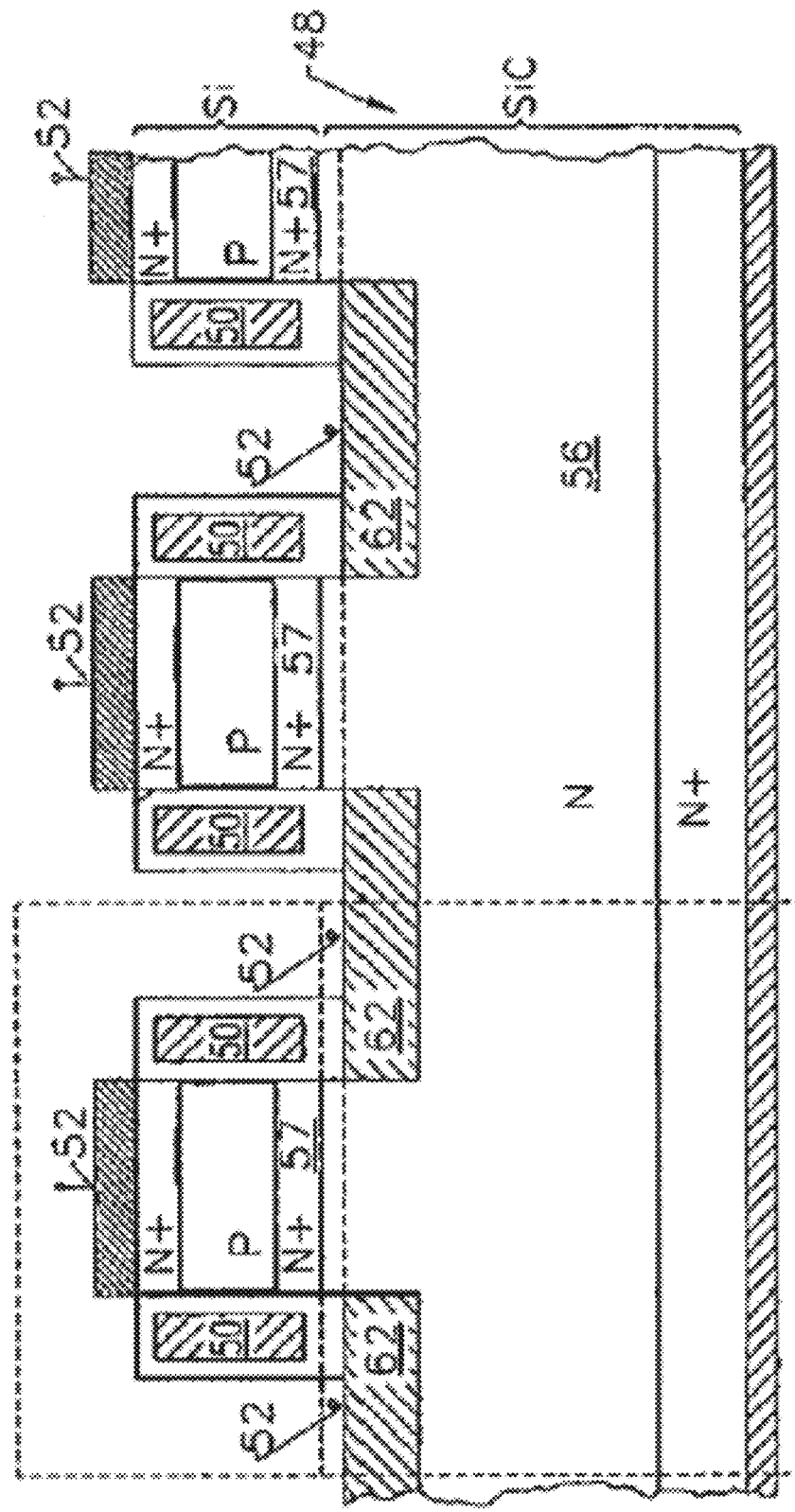
FIG. 2 is a cross sectional view of a known structure of a Si-MOSFET laminated on SiC.
Figure 4B:
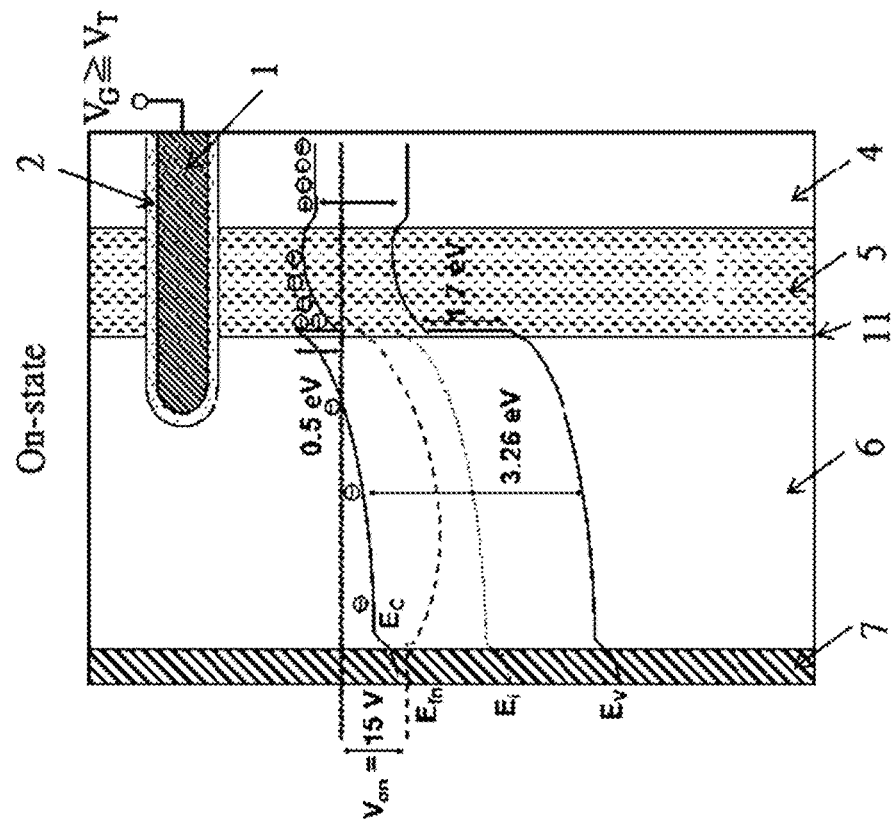
FIG. 4b is an off-state band diagram of the device of FIG. 3a taken along area A.
Figure 5A:
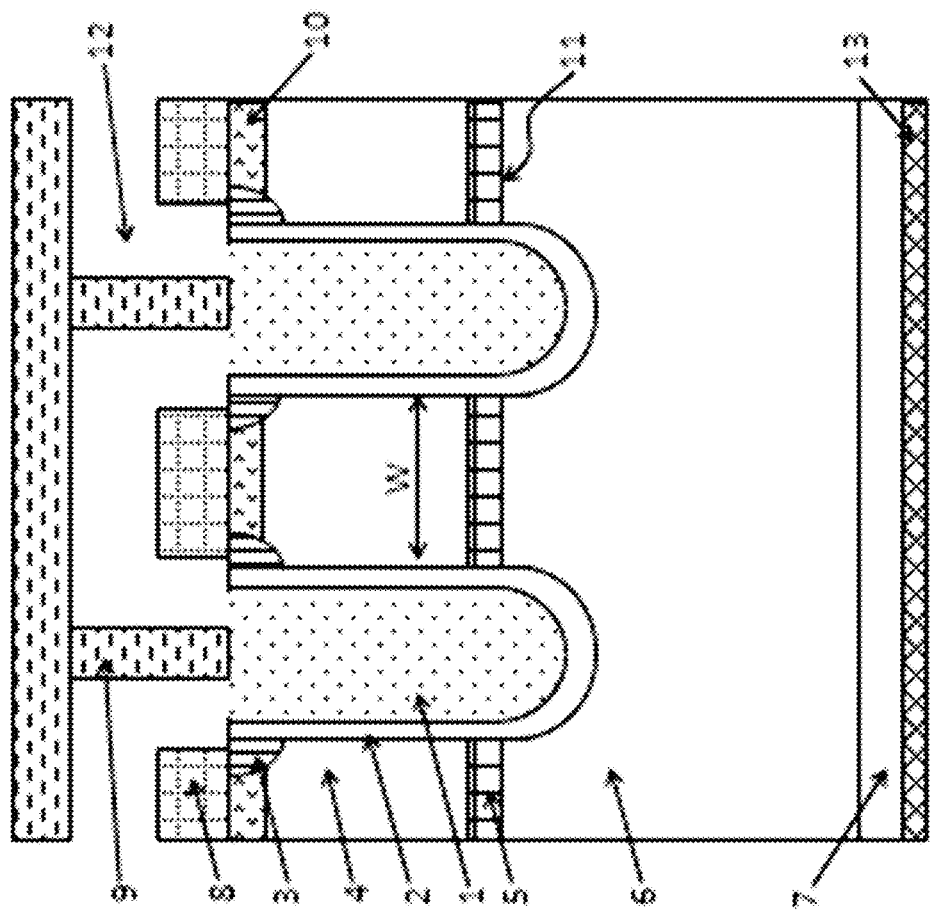
FIG. 5a is the cross sectional view related to the present invention.

On the other hand, FIG. 4b shows an energy band diagram that forms the reverse bias state in the off-state of the dashed area A in FIG. 3a. Thus, the electric field enters the P-type Si substrate from the SiC drift layer. When the electric field strength exceeds the allowable level (0.33 MV/cm) in Si, the avalanche breakdown may be caused by the impact ionization in Si. In this regard, the first approach is the narrow channel effect in the P-type Si substrate, which is to reduce the width of the P-type Si substrate between two gates. By means of the spatial edge effect produced at the end of the gate with a grounding potential, the potential distribution is modulated to suppress the electric field entering Si. In order to suppress the electric field more effectively, it is necessary to reduce the width of Si region to the limit of semiconductor micronization. As shown in FIG. 5a, the width of the P-type Si bulk layer 4 between the adjacent gates is denoted as "W." FIGS. 5b-1 and 5b-2 show that the potential distribution is spatially modulated by different widths W. FIG. 5b-1 shows a case of a large width W, and FIG. 5b-2 shows a case of a small width W. FIGS. 5b-1 and 5b-2 show the case of no barrier layer 5.

On the other hand, the second approach is to form a P-type barrier layer 5 for the electric field coming from the SiC drift layer. The P-type barrier layer 5 forms at the bottom of the Si substrate with a higher concentration than that of Si substrate. This can effectively prevent the electric field from entering the Si region. FIGS. 5b-2 and 5b-3 show a comparison with and without the barrier layer 5. Reference number 14 is a contour line of the potential.

Figure 6A:
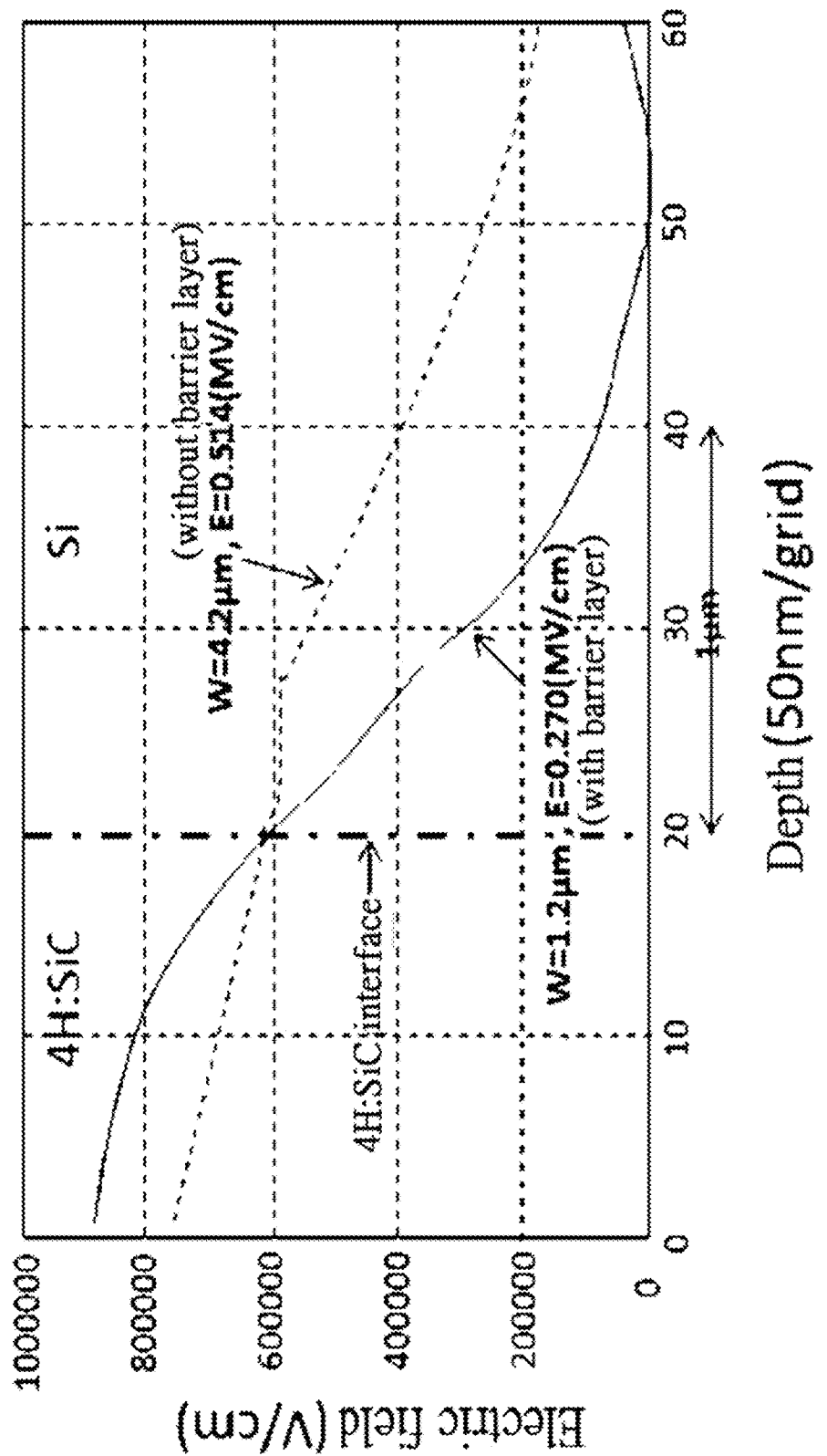
FIG. 6a shows a device simulation result aimed at an electric field distribution at a central position between the gates caused by the differences of the width between two gates in the present invention.
Figure 6B:
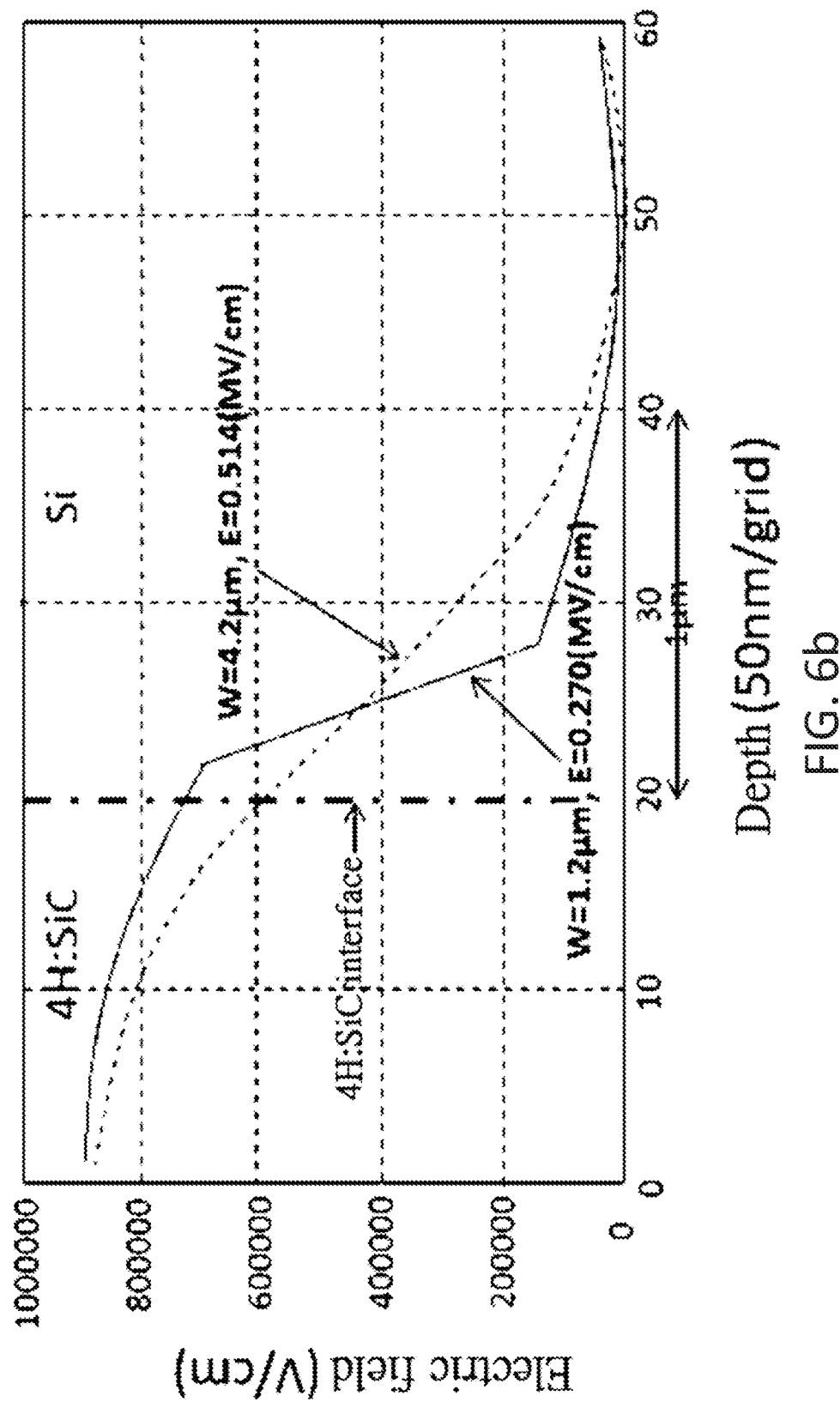
FIG. 6b is a device simulation result aimed at an electric field distribution at a central position between two gates with and without the P-type barrier layer on a Si surface.

In order to predict the effect of the above two kinds of electric field moderation methods, FIGS. 6a and 6b show the electric field distribution in the depth direction under the off-state. Here, the trench gate is set as 0V, the drain 13 is applied with a voltage of 1000V, and the SiC drift layer is set as 10 micron. FIG. 6a shows that in the first embodiment, in order to test the narrow channel effect of the first approach, the average electric field per micron in Si near the Si/SiC interface varies when the width of the P-type Si bulk layer (W in FIG. 5a) is reduced from 4.2 micron (dotted line) to 1.2 micron (solid line). It can be seen that the electric field is greatly reduced due to the narrow channel (W=1.2 micron), which modulates the electric field of SiC through the spatial edge effect and thereby reducing the potential. In addition, FIG. 6b shows the results with and without the P-type barrier layer 5 of the second approach that is on the Si surface. It can be seen from the solid line that the strength of the electric field is further reduced in the presence of the barrier layer.

In addition, an overlapping area (recess) is arranged between the gate and the N-type drift layer 6 as shown in FIG. 3a. The arrangement of the overlapping area can effectively prevent the electric field from excessively entering Si in the off-state. This is because that it is difficult for the electric field to reach the heterojunction when the trench gate serves as a barrier. It is known from the electric field dependence of the dissociation constant in Non-patent Literature 7 that by combining the narrow channel effect between the gates, the effect of P-type barrier layer 5 and the gate overlapping effect on the heterojunction, the average electric field entering Si at a depth of 1 micron is smaller than 0.2 MV/cm while the ionization multiplication coefficient is about 0.1. They have been sufficiently reduced to the extent that the avalanche breakdown will not occur.

Figure 7:
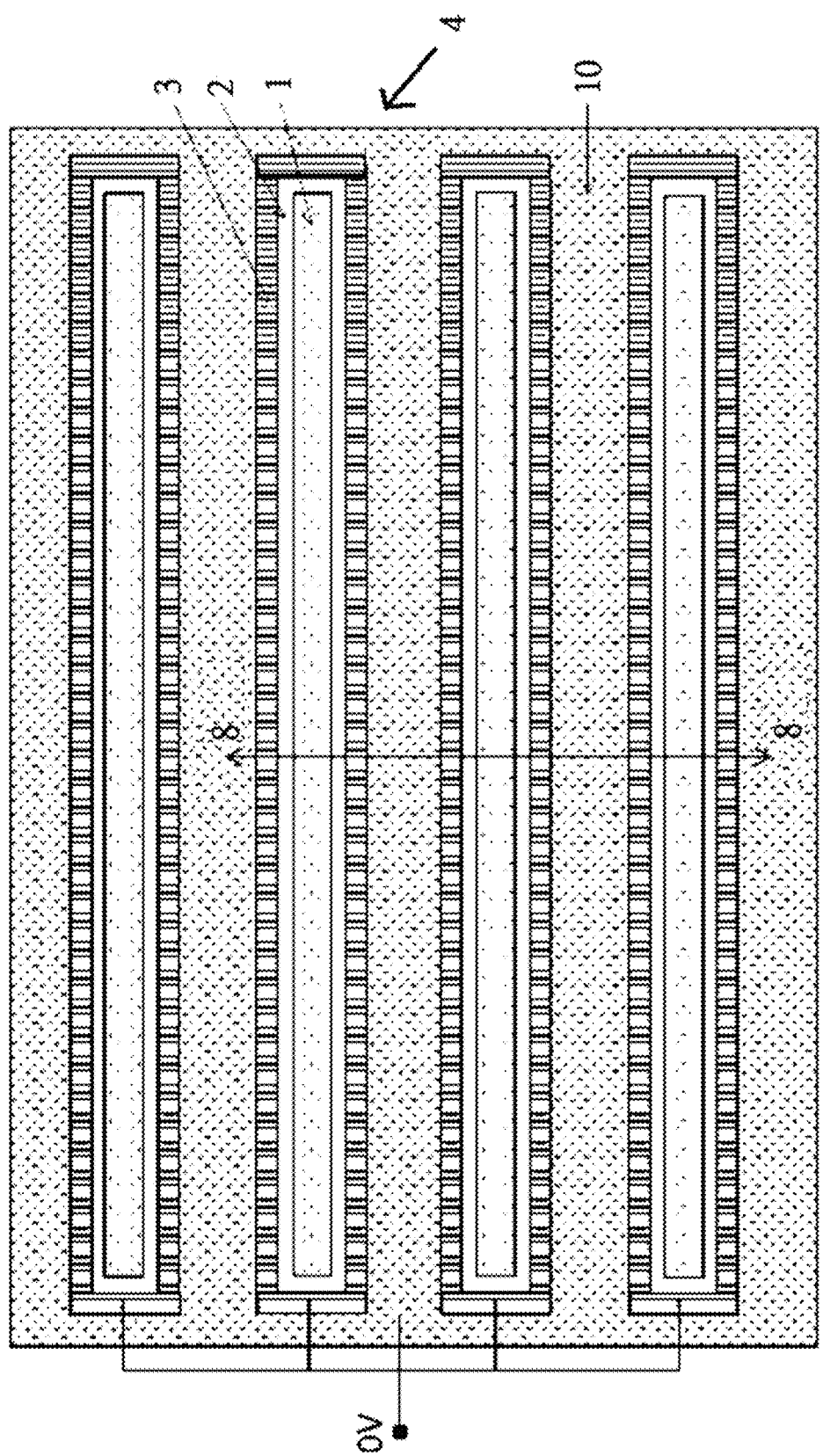
FIG. 7 is a top view of another device where a source diffusion layer encloses all of the gates.

FIG. 7 shows a plan view modified from FIG. 3a, which shows a gate 1, a gate insulating film 2, an N-type source diffusion layer 3, a P-type Si bulk layer 4 and a P-type diffusion layer 10. In this example, a single MOSFET forms a rectangular shape whose length is in the transverse direction. A plurality of MOSFETs is arranged in parallel to form an array. Each gate 1 is connected to the common gate trace 9 that has the same potential. In addition, the N-type source diffusion layer 3 and the P-type diffusion layer 10 of the MOSFET are connected to the common metal electrode 8 to produce a voltage of 0V. The upper and lower ends of the MOSFET array and the left and right ends of the MOSFET array may have the P-type Si bulk layer 4 and the P-type diffusion layer 10.

Figure 8:
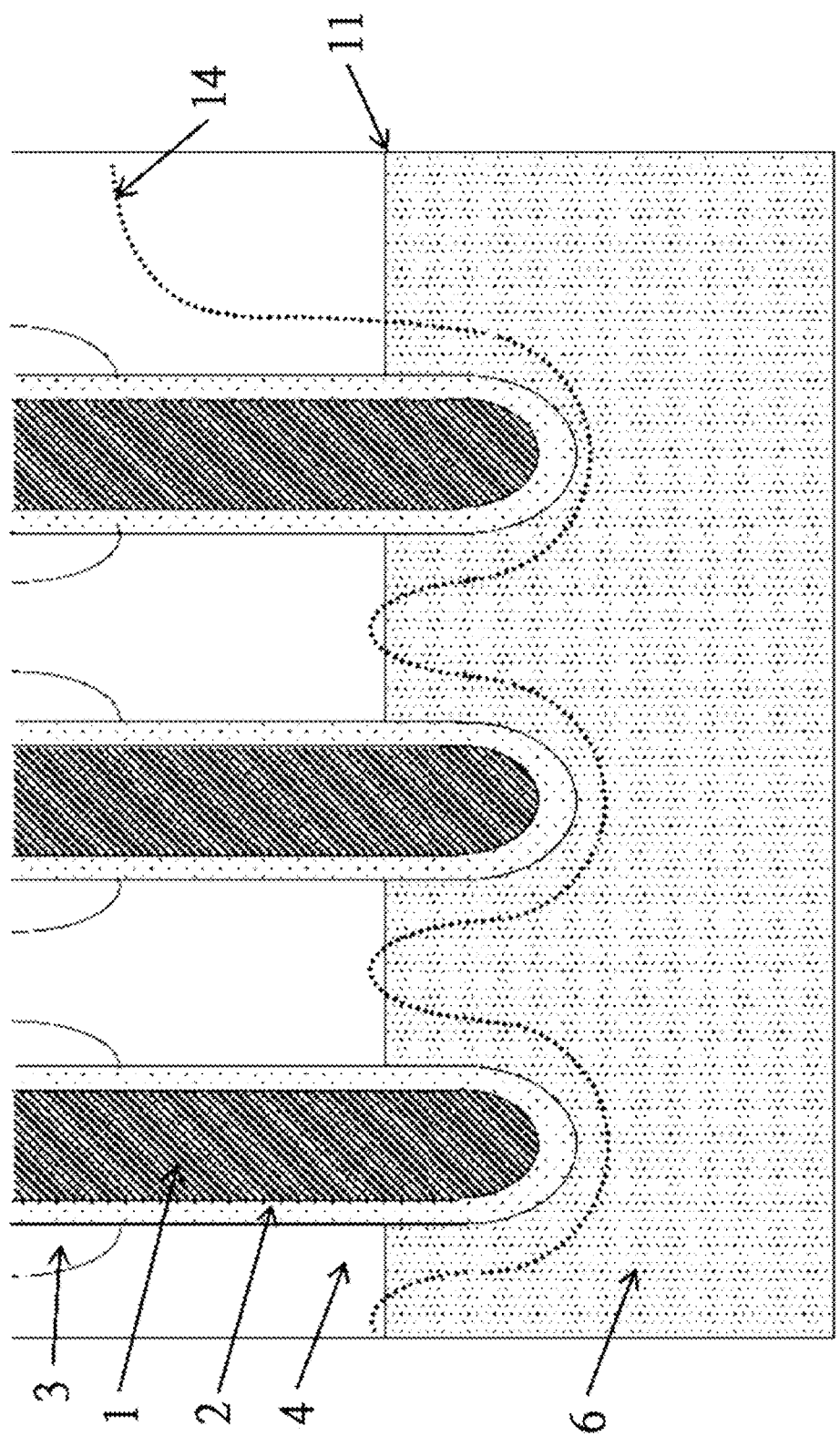
FIG. 8 shows a cross sectional view of the device of FIG. 7 taken along line 8-8 showing a potential distribution in an off-state.

FIG. 8 is a cross sectional view taken along line 8-8 of FIG. 7, showing the voltage distribution in the off-state. There exists the N-type source diffusion layer 3 and the P-type diffusion layer 10 at the gate edge (lower reference number 8 in FIG. 7). The P-type Si bulk layer 4 is an open end at the gate edge (lower reference number 8 in FIG. 7). The N-type source diffusion layer 3 and the P-type Si diffusion layer 10 are grounded (0V). Thus, the high voltage intrudes into the P-type Si bulk layer 4, forming a high electric field in the P-type Si bulk layer 4 and causing ionization. As a result, the avalanche breakdown occurs and the voltage rating is lowered.

Figure 3B:
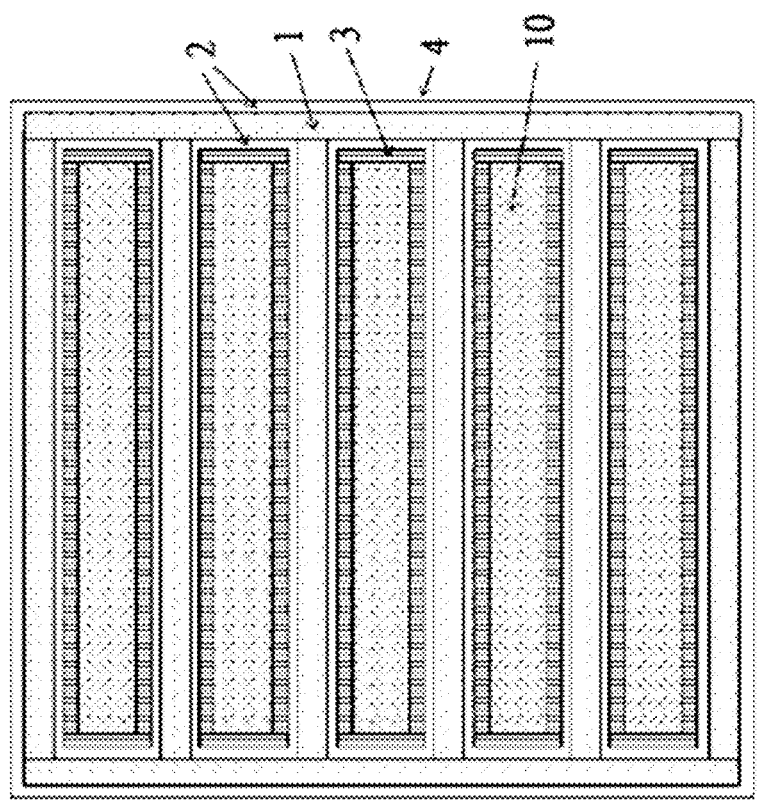
FIG. 3b is a top view of the device of the present invention.

Refer to FIG. 3b which shows a plan view of the present invention. In FIG. 3b, the N-type source diffusion layer 3 and the P-type diffusion layer 10 are enclosed by the surrounding gate 1. Furthermore, the N-type source diffusion layer 3 and the P-type diffusion layer 10 remain grounded (0V). As described above, in the off-state, the P-type Si bulk layer 4 that is enclosed by the surrounding gate 1 can suppress the entry of the electric field into Si through the narrow P-type Si bulk layer, thereby forming a small electric field. There exists no N-type source diffusion layer 3 and P-type diffusion layer 10 that are grounded as 0V outside the enclosure area of the gate 1, rendering the P-type Si bulk layer as a floating state. Thus, no electric field is produced. The structure according to the present invention can be used to implement a device with a high voltage rating. In addition, the gates 1 in the drawings are interconnected, such that there appears narrow gaps between the longer gates 1 running longitudinally and the gates 1 running transversely. In this case, the P-type Si bulk layer inwardly of the gates 1 can also suppress the entry of the electric field into Si, forming a small electric field in the narrow gap between the adjacent gates. In addition, source diffusion layers 3 or P-type diffusion layer 10 exists outside the surrounded gate, but these are electrically floating. In this case, MOSFET electrical characteristics inwardly of the gate 1 have no effect from the floating diffusion layers 3 or P-type diffusion layer 10 outside the surrounding gate.

Figure 9:
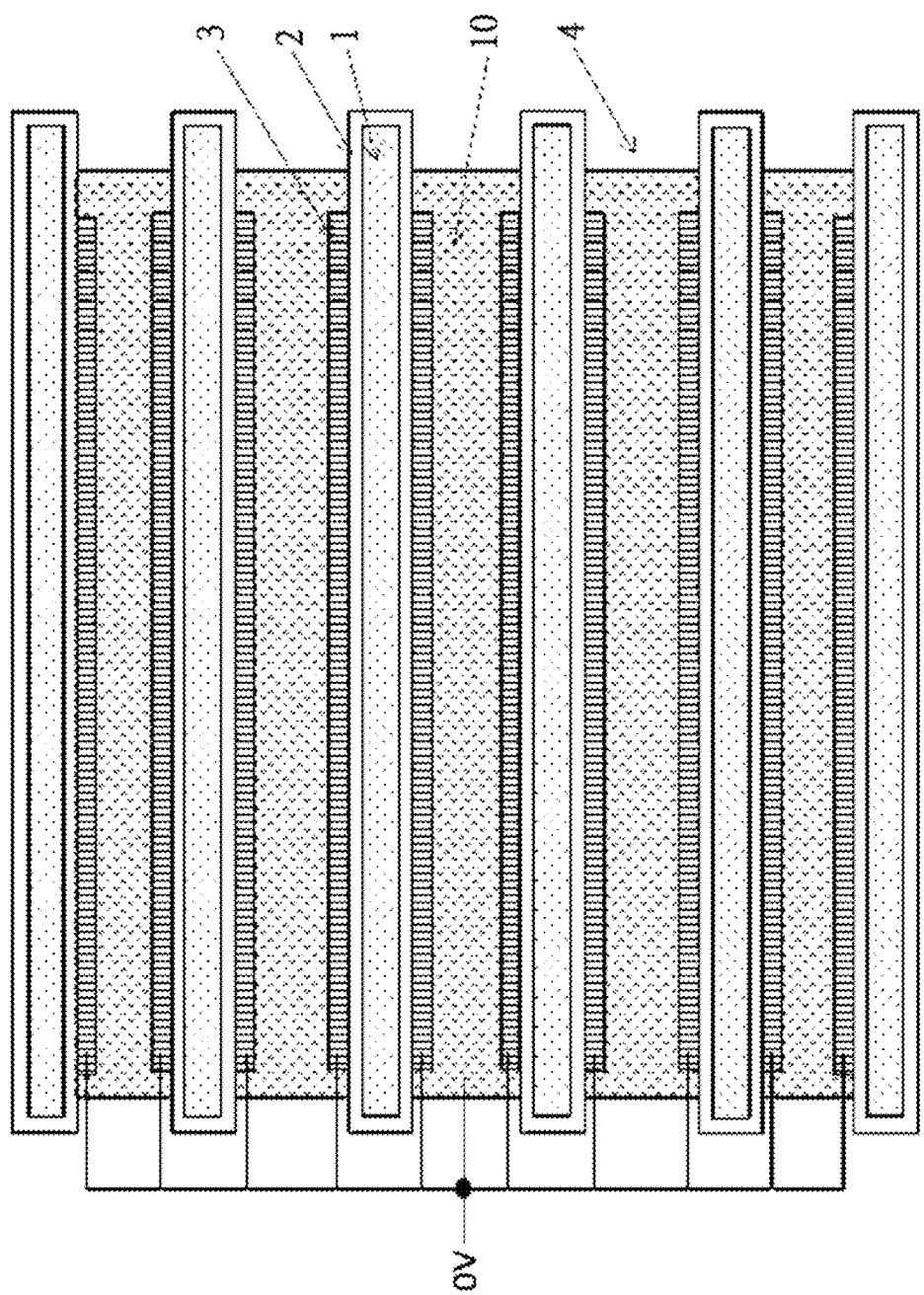
FIG. 9 is a top view of a device according to a second embodiment.

FIG. 9 is a plan view of a second embodiment of the present invention. In FIG. 9, each of the N-type source diffusion layer 3 and the P-type diffusion layer 10 has a smaller length in the transverse direction. Besides, each of the N-type source diffusion layer 3 and the P-type diffusion layer 10 has an end more inwardly of the edge of the array. Moreover, at the upper and lower ends of the array, the N-type source diffusion layer 3 and the P-type diffusion layer 10 do not form outwardly of the gate 1. The N-type source diffusion layer 3 and the P-type diffusion layer 10 remain grounded (0V) same as above. In this structure, in the off-state, the N-type source diffusion layer 3 as well as the P-type Si bulk layer 4 that is around the P-type Si bulk layer 4 are sandwiched in the gap between the opposing gates. Thus, the electric field can be suppressed from entering Si through the effect of the narrow P-type Si bulk layer, thereby forming a small electric field. As such, the portion of the P-type Si bulk layer 4 that is away from the N-type source diffusion layer 3 and the P-type diffusion layer 10 is in a floating state, which does not produce a large electric field. Therefore, the structure according to the present invention can be used to realize a device with a high voltage rating. It is preferable that the two ends of each of the source diffusion layer and the P-type Si diffusion layer are inward of the two ends of the each of the plurality of gates by 2 μm or more, respectively. In addition, source diffusion layers 3 or P-type diffusion layer 10 exists outside the surrounded gate, but these are electrically floating. In this case, MOSFET electrical characteristics inwardly of the gate 1 have no effect from the floating diffusion layers 3 or 10 outside the surrounding gate.

Figure 10:
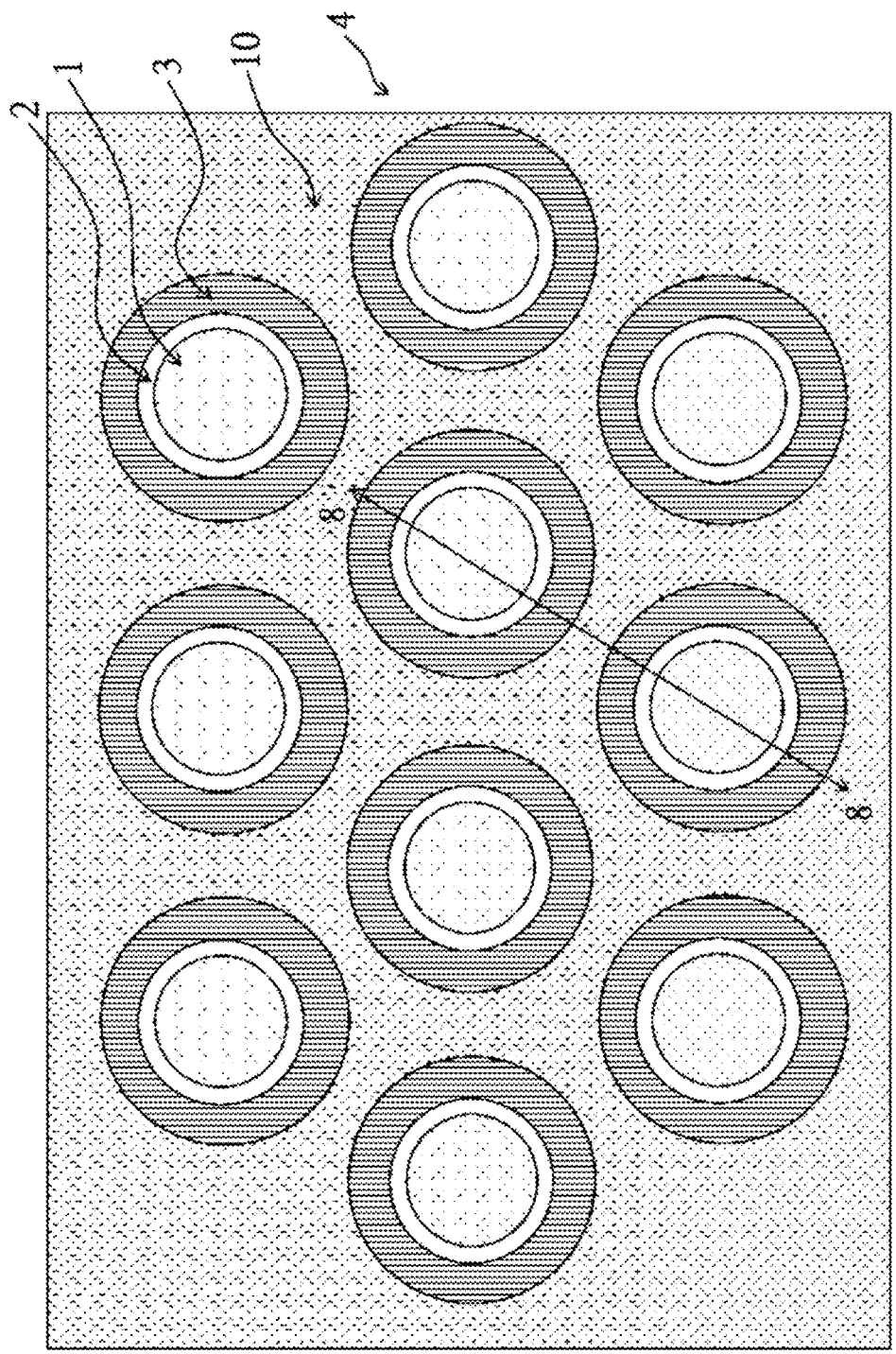
FIG. 10 is a partial, top view of the device according to a third embodiment.

FIG. 10 is a top view of a third embodiment of the present invention. The gate 1 forms an array of a plurality of circular elements when viewed from the top down. Each gate 1 is enclosed by the gate insulating film 2 which is in turn enclosed by the N-type source diffusion layer 3. Any one of the gates (having a circular shape when viewed from the top down) is enclosed by six gates that are arranged in a hexagonal manner. Arranged between the adjacent N-type source diffusion layers 3 is the P-type Si diffusion layer as formed. The gates 1 are interconnected via gate trace 9 to form the same potential. Each of the N-type source diffusion layer 3 and the P-type diffusion layer 10 is connected to the source diffusion layer and the metal electrode 8 to be grounded.

Figure 11:
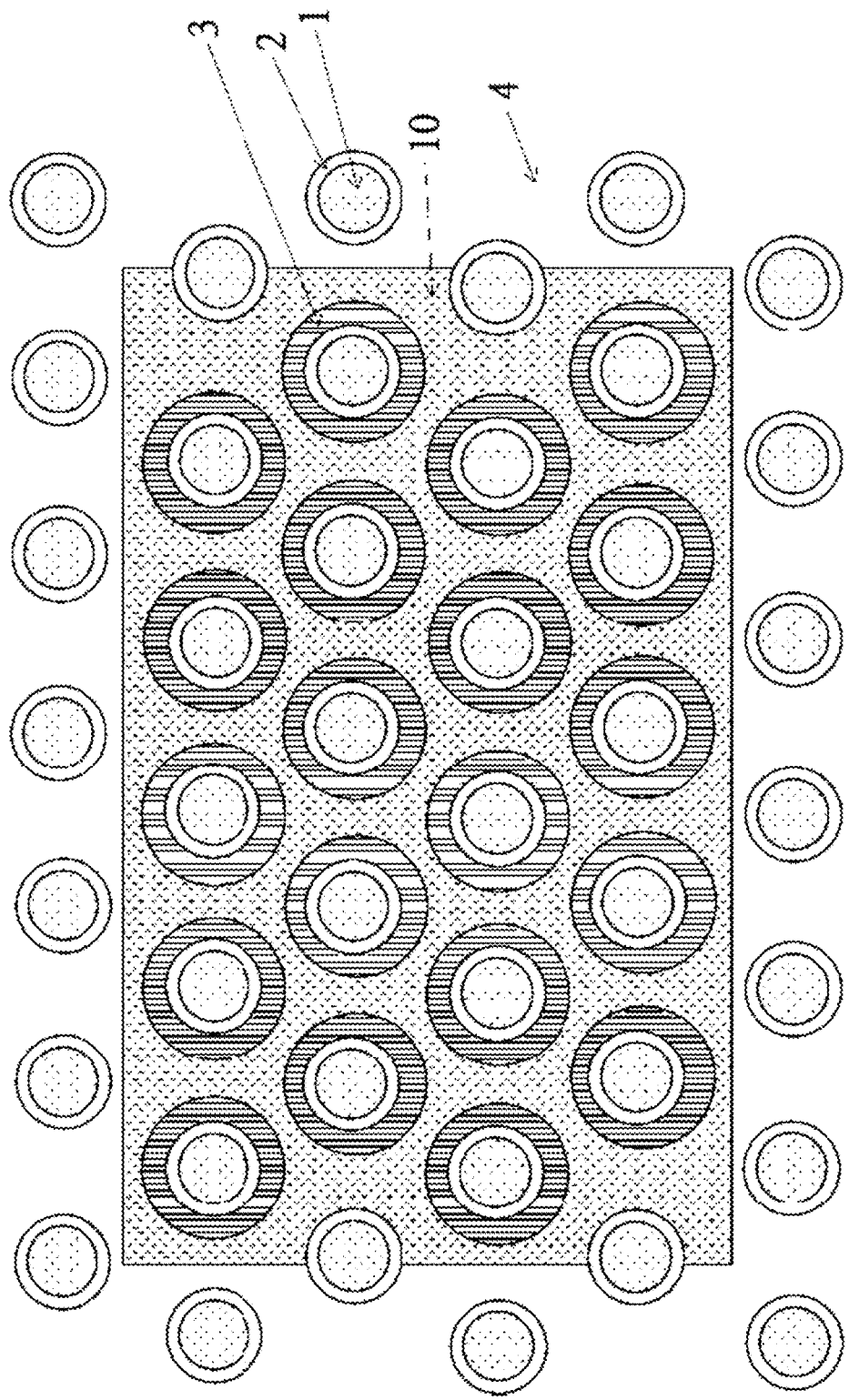
FIG. 11 is a full, top view of the device of FIG. 10 according to the third embodiment.

FIG. 11 is a plan view of a MOSFET array according to a third embodiment of the present invention. The arrays of the N-type source diffusion layers 3 and the P-type diffusion layer 10 are more inwardly of the array of the gates and are not located at the edge of the array of the gates. In this configuration, in the off-state, the N-type source diffusion layer 3 as well as the P-type Si diffusion layer 10 that is around the P-type Si bulk layer 4 are sandwiched in the narrow area between the opposing gates 1. Thus, the electric field can be suppressed from entering Si through the effect of the narrow P-type Si bulk layer 4, thereby forming a small electric field. As such, the portion of the P-type Si bulk layer 4 that is away from the N-type source diffusion layer 3 and the P-type diffusion layer 10 is in a floating state, which does not produce a large electric field. Therefore, the structure according to the present invention can be used to realize a device with a high voltage rating.

By virtue of the present invention, the power semiconductor with high power, high efficiency and low noise can be realized, which contributes to reducing the total power consumption of the social infrastructure and helps to improve the environmental problems such as global warming.

What is claimed is:

1. A power semiconductor device comprising:
a SiC substrate with a first conductive type;
a Si substrate with a second conductive type different from the first conductive type, wherein the SiC substrate includes a drain, a first drain diffusion layer with the first conductive type, and a second drain diffusion layer with the first conductive type on a back of the SiC substrate, wherein the second drain diffusion layer has a lower concentration than that of the first drain diffusion layer, wherein a metal-oxide-semiconductor (MOS) structure forms by excavating a trench from one surface of the Si substrate to an inner part of the SiC substrate which is deeper than that of the Si/SiC interface; and
an insulating film disposed on a side of the trench of the MOS structure as a gate insulating film, wherein a gate material is disposed into the trench to form one of a plurality of gates, wherein the Si substrate includes a source diffusion layer with the first conductive type, wherein the source diffusion layer adjoins the gate insulating film, wherein a substrate diffusion layer with the second conductive type on an upper part of the Si substrate adjoins the source diffusion layer, wherein the source diffusion layer with the first conductive type and a Si diffusion layer with the second conductive type remain grounded, wherein the plurality of gates is arranged in parallel to form an array, wherein each of the plurality of gates is in a bar shape, wherein the plurality of gates is connected to a gate trace to have a same potential, wherein the source diffusion layer and the Si diffusion layer exist only on a portion of the Si substrate that is sandwiched between the plurality of gates, and wherein the source diffusion layer and the Si diffusion layer do not exist on another portion of the Si substrate that is sandwiched between the plurality of gates at ends of the array, providing an arrangement that the source diffusion layer and the Si diffusion layer are enclosed by the plurality of gates when viewed from a top of the power semiconductor device.

2. The power semiconductor device as claimed in claim 1, wherein the plurality of gates is parallel to the source diffusion layer and the Si diffusion layer in the MOS structure, wherein each of the source diffusion layer and the Si diffusion layer has a length shorter than that of each of the plurality of gates, and wherein each of the source diffusion layer and the Si diffusion layer has two ends more inward than two ends of each of the plurality of gates, respectively.

3. The power semiconductor device as claimed in claim 2, wherein the two ends of each of the source diffusion layer and the P-type Si diffusion layer are inward of the two ends of the each of the plurality of gates by 2 µm or more, respectively.

4. The power semiconductor device as claimed in claim 1, wherein the array which forms from the plurality of gates has two ends respectively enclosed by another two gates in addition to the plurality of gates, wherein the plurality of gates forms a plurality of spaces therebetween, wherein each of the plurality of spaces is located between two adjacent ones of the plurality of gates, and wherein the source diffusion layer and the Si diffusion layer are located only in the plurality of spaces.

5. The power semiconductor device as claimed in claim 1, wherein a gate in the MOS structure is a trench gate, and wherein a top of the trench gate is located in a SiC drift layer with the first conductive type at a depth of more than 0.5 micron.

6. The power semiconductor device as claimed in claim 1, wherein the plurality of gates is arranged in parallel to increase a channel width, and wherein a horizontal width of the Si substrate between the plurality of gates is less than 2 micron.

7. The power semiconductor device as claimed in claim 1, wherein a barrier diffusion layer with the second conductive type which has a higher concentration than that of the Si substrate forms at a bottom of the Si substrate connecting to the Si/SiC interface.

8. The power semiconductor device as claimed in claim 1, wherein the Si substrate has a region joined to the SiC substrate of the Si substrate, and wherein the region has a concentration of larger than $10^{17}/cm^3$.

9. The power semiconductor device as claimed in claim 1, wherein a thickness of the oxide film at a bottom of a trench gate formed in a part of the Si substrate and a SiC drift layer of the first conductive type is larger than the thickness of the oxide film at a side of the trench gate.

10. The power semiconductor device as claimed in claim 1, wherein a material used for the SiC substrate directly joined by the Si substrate is a wide bandgap material other than SiC, and wherein the material is GaN, $Ga_2O_3$ or diamond.

11. A power semiconductor device comprising:
a SiC substrate with a first conductive type;
a Si substrate with a second conductive type different from the first conductive type, wherein the SiC substrate includes a drain, a first drain diffusion layer with the first conductive type, and a second drain diffusion layer with the first conductive type on a back of the SiC substrate, wherein the second drain diffusion layer has a lower concentration than that of the first drain diffusion layer, wherein a metal-oxide-semiconductor (MOS) structure forms by excavating a trench from one surface of the Si substrate to an inner part of the SiC substrate which is deeper than that of the Si/SiC interface; and
an insulating film disposed on a side of the trench of the MOS structure as a gate insulating film, wherein a gate material is disposed into the trench to form one of a plurality of gates, wherein the Si substrate includes a plurality of source diffusion layers with the first conductive type, wherein the plurality of source diffusion layers adjoins the gate insulating film, wherein a substrate diffusion layer with the second conductive type on an upper part of the Si substrate adjoins the plurality of source diffusion layers, wherein the plurality of source diffusion layers and the Si diffusion layer remain grounded, wherein each of the plurality of gates has a circular radial cross section, wherein each of the plurality of gates is circular when viewed from a top of the power semiconductor device, wherein the plurality of gates is connected to a gate trace to have a same potential, wherein the plurality of source diffusion layers encloses the plurality of gates, and wherein the Si diffusion layer is disposed among the plurality of source diffusion layers.

12. The power semiconductor device as claimed in claim 11, wherein one of the plurality of gates is surrounded by six adjacent ones of the plurality of gates that are arranged in a hexagonal manner.

13. The power semiconductor device as claimed in claim 11, wherein some of the plurality of gates that are arranged at ends of the array in the MOS structure are not enclosed by the plurality of source diffusion layers, and wherein the substrate diffusion layer is not arranged around the some of the plurality of gates at the ends of the array.

14. The power semiconductor device as claimed in claim 11, wherein a gate in the MOS structure is a trench gate, and wherein a top of the trench gate is located in a SiC drift layer with the first conductive type at a depth of more than 0.5 micron.

15. The power semiconductor device as claimed in claim 11, wherein a barrier diffusion layer with the second conductive type which has a higher concentration than that of the Si substrate forms at a bottom of the Si substrate connecting to the Si/SiC interface.

16. The power semiconductor device as claimed in claim 11, wherein the Si substrate has a region joined to the SiC substrate of the Si substrate, and wherein the region has a concentration of larger than $10^{17}/cm^3$.

17. The power semiconductor device as claimed in claim 11, wherein a thickness of the oxide film at a bottom of a trench gate formed in a part of the Si substrate and a SiC drift layer of the first conductive type is larger than the thickness of the oxide film at a side of the trench gate.

18. The power semiconductor device as claimed in claim 11, wherein a material used for the SiC substrate directly joined by the Si substrate is a wide bandgap material other than SiC, and wherein the material is GaN, $Ga_2O_3$ or diamond.

* * * * *